United States Patent

Fang et al.

[15] 3,675,140

[45] July 4, 1972

[54] ACOUSTIC WAVE AMPLIFIER HAVING A COUPLED SEMICONDUCTOR LAYER

[72] Inventors: Frank F. Fang, Yorktown Heights; Eric G. Lean, Mahopac, both of N.Y.

[73] Assignee: International Business Machines Corporation, Armonk, N.Y.

[22] Filed: June 30, 1970

[21] Appl. No.: 51,286

[52] U.S. Cl. ...............................330/5.5, 330/12, 332/16 R, 333/70

[51] Int. Cl. ...............................H03f 3/04

[58] Field of Search ...............................330/5.5

[56] References Cited

UNITED STATES PATENTS

| | | | |
|---|---|---|---|
| 3,388,334 | 6/1968 | Adler | 330/5.5 |
| 3,582,540 | 6/1971 | Adler et al. | 330/5.5 |
| 3,200,354 | 8/1965 | White | 330/5.5 |

OTHER PUBLICATIONS

White, " Proc. IEEE," Aug. 1970, pp. 1,238- 1,276.
Chao, " Applied Physics Letters," May 15, 1970, pp. 399-401.

*Primary Examiner*—John Kominski
*Assistant Examiner*—Darwin R. Hostetter
*Attorney*—Hanifin and Jancin and Jackson E. Stanland

[57] ABSTRACT

An amplifier for Rayleigh surface acoustic waves in which an additional control is provided. A region of variable conductivity is located in close proximity to the surface on which the acoustic wave travels. Examples of this region are an inversion layer whose conductivity is controlled by electrical bias, and a bulk region whose conductivity is controlled by a variable width depletion region. The electric field produced by moving charge carriers in the variable conductivity region interacts with the piezoelectric field produced by the acoustic wave to transfer energy to the acoustic wave, or extract energy from this wave.

15 Claims, 7 Drawing Figures

INVENTORS
FRANK F. FANG
ERIC G. LEAN

BY J. E. Sa[illegible]

AGENT

ACOUSTIC WAVE AMPLIFIER HAVING A COUPLED SEMICONDUCTOR LAYER

CROSS REFERENCE TO RELATED APPLICATIONS

Copending patent application S.N. 51,287 assigned to the same assignee as the present invention and filed the same day as this application, describes a parametric amplifier for surface acoustic waves in which wave velocity changes are produced by varying the conductivity of the surface on which the acoustic wave travels.

BACKGROUND OF THE INVENTION

1. Field of the Invention

This invention relates to surface acoustic wave amplifiers and more particularly to such amplifiers in which additional electronic control is provided for changing the gain and modulation of these amplifiers.

2. Description of the Prior Art

Surface acoustic wave amplifiers are known in which there is a coupling between the electric fields associated with a traveling surface acoustic wave and an electric field produced by the movement of charge carriers in an adjacent semiconductor. That is, moving charge carriers are bunched and the piezoelectric wave couples the surface acoustic wave and the drifting charge carriers. The amplitude of the acoustic wave is modified due to the interaction of the charge bunches in the adjacent semiconductor and the electric charge carrier flow established in that semiconductor by a bias voltage across it. When the phase velocity of the surface acoustic wave is less than the charge carrier velocity in the semiconductor, the acoustic wave will gain energy from the electric current stream. When the velocity of the charge carriers is less than the phase velocity of the acoustic wave, energy flow will be in the other direction and the charge carriers will be amplified at the expense of the surface acoustic wave.

U.S. Pat. No. 3,388,334 describes a surface wave amplifier utilizing the above-mentioned principles. In particular, an adjacent semiconductor has a charge carrier flow therethrough and the electric field set up by this charge carrier flow interacts with the electric field produced by a surface acoustic wave propogating on a nearby piezoelectric medium. In order to properly operate such amplifiers, the semiconductor film containing the charge carriers must be properly doped in order to produce sufficient coupling between the electric field of the charge carriers and that of the acoustic wave. In these prior amplifiers, it is not possible to shift the frequency at which maximum gain occurs; once the initial doping is set there is only one frequency corresponding to maximum gain in the device.

In addition, there is no way to change the gain of such devices except by varying the voltage across the semiconductor material. Changing this voltage changes the velocity of the charge carriers but does not change the number of such carriers.

Another disadvantage of these prior devices results from excessive heat build-up, since current flow is through the entire volume of the semiconductor layer. Also, since the Rayleigh surface wave decays exponentially from the surface, the electric field associated with such a wave will not penetrate far into the adjacent semiconductor through which the charge carriers are traveling. Therefore, a large portion of the charge carriers will not interact with the surface acoustic wave to deliver energy to such wave. This represents considerable inefficiency and leads to excessive heat build-up due to large currents in the semiconductor layer. In many cases, additional heat sink layers are provided to aid in dissipating the heat established during operation of these amplifiers. Excess current in the semiconductor layer is not useful and makes CW operation more difficult.

From the foregoing, it is apparent that prior surface wave amplifiers could change the amount of amplification of a signal wave only by changing the carrier concentration in the semiconductor layer (which can not be varied during operation of the device), or by changing the magnitude of the applied voltage on the semiconductor material through which the charge carriers flow. However, it is difficult to change the gain of the device through change of the coupling coefficients when the initial carrier concentration is fixed.

Accordingly, it is a primary object of this invention to provide an amplifier for surface acoustic waves having additional control means for modulation of the acoustic wave.

Another object of this invention is to provide a surface acoustic wave amplifier having improved efficiency and minimal heat build-up.

Still another object of this invention is to provide a surface acoustic wave amplifier which is easy to fabricate and is easily modulated by a combination of variable mechanisms.

A further object of this invention is to provide an amplifier whose frequency of maximum gain can be shifted during device operation.

SUMMARY OF THE INVENTION

This surface acoustic wave amplifier includes a first medium capable of supporting a traveling Rayleigh acoustic wave on one surface thereof. The medium is a piezoelectric medium, such as gallium arsenide, cadmium sulfide, zinc oxide, quartz, lithium niobate, etc. If it is a semiconductor, it can have either N-type or P-type conductivity. Preferably, the piezoelectric medium has insulating or semi-insulating properties, or has weak N-type or P-type conductivity. Located on a surface of this medium is means for launching the Rayleigh surface acoustic wave and means for detecting such surface acoustic waves. This means is generally a transducer whose form is not critical. For instance, a digital transducer or a wedge transducer, both of which are well known in the art, can be employed. The means for launching the surface acoustic wave and for detecting the wave are not critical to the practice of this invention.

Located adjacent the surface of the piezoelectric medium on which the surface acoustic wave travels is a second medium having a region whose electrical conductivity can be varied. The region of variable conductivity is located very close to the surface of the first medium on which the surface wave travels, or is actually in contact with the surface of the first medium. To prevent attenuation of the surface wave, the adjacent surfaces of the first and second medium are polished, either by mechanical means or by chemical means. This polishing is usually to a smoothness of approximately fractions of the acoustic wave lengths.

In illustrative embodiments, the region whose conductivity can be varied is chosen to be either an inversion layer or a bulk layer having a depletion layer therein. In both cases, the conductivity of the region can be varied by changing an electrical bias on the region. If an inversion layer is used, an oxide layer can be placed between the piezoelectric first medium and the second medium which has a region of variable conductivity. The oxide layer aids in inducing an inversion layer on the surface of the second medium.

The second medium can comprise several materials, among which are semiconductors such as silicon, germanium, gallium arsenide, etc., and can be either N-type or P-type conductivity. In the case of an inversion layer, thickness of the second medium is not critical, since the only portion of it which carries current is the surface depletion layer. In the case where the variable conductivity region is a bulk layer having a depletion layer therein, the thickness of the bulk layer is chosen so that the depletion layer will extend across its entire width upon the application of a reasonable bias. That is, the depletion layer width should be sufficient to reduce the conductivity of the bulk layer to zero.

Connected across the second medium is a means for accelerating charge carriers in this medium. Such acceleration means is generally a voltage source whose output is variable in magnitude and polarity. The function of the voltage source is to accelerate charge carriers in the second medium (more particularly, in the region of variable conductivity) to velocities which are greater than that of the surface acoustic wave on the piezoelectric first medium.

By the principles mentioned previously, there is an interaction between the electric field established by the propagating surface acoustic wave in the piezoelectric medium and the propagating charge carriers in the second medium. This interaction interchanges energy between the propagating wave and the current carrier stream. If the average current carrier velocity is greater than the wave velocity, the latter will be amplified.

In an amplifier having a region whose conductivity can be varied, an additional control is obtained. That is, by varying an applied voltage, the conductivity of the region is varied so as to change both the gain of the device and the coupling coefficient between the electric field associated with the moving charge carriers and the electric field associated with the piezoelectric acoustic wave. It is possible to completely remove charge carriers from this region or to greatly increase the number of charge carriers in this region. This change in conductivity in a small region can be changed during operation. The sensitivity of this change in conductivity with respect to the bias voltage depends on the doping level of the second medium. Of course, the velocity of the charge carriers in the region can be changed in the usual way by changing the voltage which accelerates such carriers.

In addition to increased modulation control, excess current is not required since the actual current flow is confined to a very thin inversion layer or region adjacent a depletion layer. This eliminates excess current and consequent heat build-up. Further, the device becomes easier to fabricate and has a considerably reduced heat dissipation problem. Efficiency is increased since the total current available contributes to the interaction with the electric field due to the traveling surface acoustic wave.

The region of variable conductivity also serves as a means for shifting the frequency $\omega_c$ at which the maximum gain of the amplifier occurs. Since $\omega_c \approx (o/\epsilon)$ if diffusion can be neglected, where $o$ = conductivity and $\epsilon$ is the dielectric constant, $\omega_c$ can be changed by varying the electrical bias on the region of variable conductivity.

The foregoing and other objects, features and advantages of the invention will be apparent from the following more particular description of the preferred embodiments of the invention as illustrated in the accompanying drawings.

DESCRIPTION OF THE PREFERRED EMBODIMENT

Figure 1A:
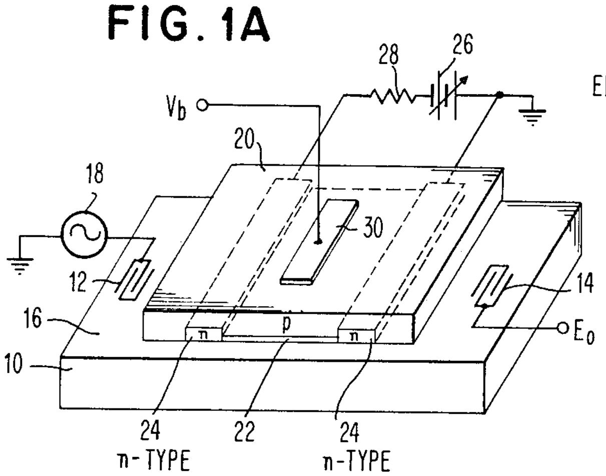
FIG. 1A shows a surface acoustic wave amplifier having an induced inversion layer in close proximity to the surface on which the surface acoustic wave travels.

FIG. 1 shows a surface acoustic wave amplifier having a region of variable conductivity located adjacent the surface on which the surface acoustic wave travels. In this case, the adjacent variable conductivity region is an induced inversion layer in a semiconductor material.

In more detail, a wave propagating medium 10 has input transducer 12 and output transducer 14 located on its top surface 16. Generally, this medium will be a piezoelectric medium, such as gallium arsenide, cadmium sulfide, zinc oxide, quartz, lithium niobate, etc. These materials are all well known and any material having a piezoelectric property will be suitable.

Connected to input transducer 12 is a variable voltage source 18, which excites the input transducer to produce an acoustic wave on surface 16 of medium 10. This wave is generally a Rayleigh wave which is well understood in the art. Such a wave decays exponentially from the surface 16 on which it is traveling and, therefore, any interaction with this wave must occur in a region close to the wave propagating surface. Input and output transducers 12, 14 are shown as interdigital transducers, although other forms are acceptable. Again, these are well known in the art and it is only important that the transducers chosen be sufficient for launching and detecting a Rayleigh acoustic wave on the surface of medium 10.

Located on surface 16 of mediumm 10 is a semiconductor 20 having an induced inversion layer 22 in contact with surface 16 of medium 10. In the examples illustrated, semiconductor 20 is P-type conductivity and N-type regions 24 are provided therein. Connected across these N-type regions 24 is a variable voltage source 26 and a series connected resistor 28. Substrate bias to P-type semiconductor 20 is provided by a voltage source $V_b$, such as a variable DC source or an AC source, connected to semiconductor 20 by electrode 30.

An inversion layer 22 having N-type conductivity is formed in a very narrow region on the bottom surface of semiconductor 20. Formation of this region is well known in the art, and can be caused by mechanisms such as surface states, etc. Overlying medium 20 can be any material, including semiconductors such as silicon, germanium, gallium arsenide, etc. It can be N or P type.

The function of overlying medium 20 is to provide moving charge carriers which create an electric field that couples to the electric field produced by the traveling acoustic wave on surface 16 of medium 10. For this purpose, charge carrier flow is confined to thin inversion layer 22 adjacent surface 16. As mentioned previously, a surface acoustic wave decays exponentially from the surface on which it is traveling. Therefore, for an amplifying interaction of the type taught in U.S. Pat. No. 3,388,334, it is necessary that flowing charge carriers be provided very close to surface 16 on which the Rayleigh acoustic wave travels. In the amplifier of FIG. 1A, all current flow is in a small layer 22 immediately adjacent surface 16 of medium 10. This means that all charge carriers contribute to the interaction which amplifies the acoustic wave, in distinction with prior art amplifiers. This has an additional feature in that there is no excess current in overlying medium 20, so heat build-up in this medium is minimized.

Figure 1B:
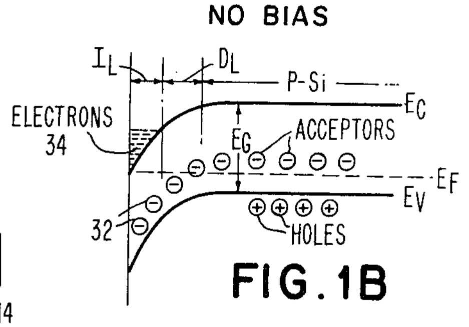
FIG. 1B is an energy band diagram of the amplifier of FIG. 1A, with substrate bias $V_b$ equal to zero.
Figure 1C:
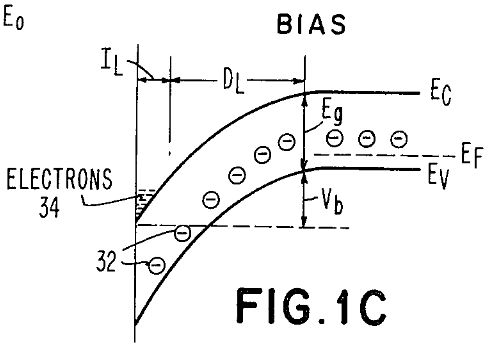
FIG. 1C is an energy band diagram of the amplifier of FIG. 1A with a finite, non-zero substrate bias $V_b$.

Use of a variable conductivity region in close proximity to the surface on which the Rayleigh travels allows an additional control on the amplification of the acoustic wave. An additional control is provided by variable substrate bias $V_b$. By changing the substrate bias, the conductivity (number of charge carriers) in inversion layer 22 is varied. For instance, applying a positive potential to this region will attract electrons to the substrate contact 30, causing a decrease in the number of charge carriers in N-type inversion layer 22. Because amplification is directly proportional to the number of charge carriers in region 22, there will be a corresponding decrease in amplification of the surface acoustic wave. This will be more apparent when the energy band diagrams of FIGS. 1B and 1C are discussed.

The variable conductivity region, together with bias source $V_b$ is also a means for varying the frequency $\omega_c$ at which maximum gain varies. Since $\omega_c \approx (o/\epsilon) = (\eta e \mu/\epsilon)$, where $\eta$ is the number of charge carriers, $\mu$ is the mobility, and $e$ is the electronic charge, a change in the number of charge carriers $n$ will change $\omega_c$. Thus a kind of filter can be provided which depends on the bias $V_b$.

When the semiconductor 20 is in contact with the underlying wave propagation wave medium 10, the top surface 16 of this medium is generally polished in order to avoid loading the acoustic wave by the overlying medium 20. Also, it is possible to have a thin oxide layer (of approximately 500 A in thickness) between the wave propagating medium 10 and the overlying medium 20. As is well known to those in the semiconductor field, the presence of such an oxide layer induces more inversion in layer 22. This is generally caused by ions present in the oxide layer.

The inversion layer 22 has a thickness of about a few hundred angstroms to 1,000 angstroms, while the thicknesses of the wave propagating medium 10 and the overlying semiconductor 20 are not critical. Since the Rayleigh wave travels on the surface of medium 10, its thickness is not critical. Since the only current conduction is in inversion layer 22, the total thickness of the overlying medium 20 is also not critical.

For the amplifier of FIG. 1A, the following relationship exist.

$$N_{dep}=\sqrt{\frac{Kn_a(V_{eg}+V_b)}{2\pi q}} \qquad (1)$$

$$N_{inr}=N_s-N_{dep} \qquad (2)$$

$$\sigma_s=qN_{inr}\mu_s \qquad (3)$$

where $N_{dep}$ is the number of fixed charges per unit area in the depletion region, $N_{inr}$ is the number of free electrons per unit area in the inversion layer, $k$ is the dielectric constant of the semiconductor, $V_b$ is the substrate bias voltage, $V_{eg}$ is the semiconductor energy gap divided by q, $q$ is the electronic charge, $\mu_s$ is the surface electron mobility, $n_a$ is the doping level of p-type material, $o_s$ is the surface conductivity, and $o_s^\circ$ is the surface conductivity at zero bias $V_b$.

If $n_a$ is about $10^{16}$ impurities/cm$^3$, $N_s$ is about $10^{13}$ charges/cm$^2$, and $\mu_s$ is about 1,000 cm$^2$/volt-second, then $o_s^\circ$ is about $1.6\times10^{-2}$mho/square, and $o_s \rightarrow 0$ at $V_b \simeq 4.3$ volts.

Thus for a small bias voltage $V_b \simeq 4.3$ volts, the amplifier inversion layer can be switched from conducting to non-conducting.

The doping levels in the second medium are not critical. For instance, if it is either N- or P-type, the doping of medium 20 can be approximately $10^{16}$–$10^{17}$ impurities/cm$^3$. The amount of doping here just changes the sensitivity (i.e., the amount of change of $V_b$ required to change amplification). Since $N_{dep}$ is proportional to the square root of the product of $N_a$ and $V_b$, for a given $V_b$, the heavier the doping, the more surface charge removed. This can be explained simply by saying that the junction becomes more sensitive with bias as the doping is increased.

The device operates as follows. A surface acoustic wave is launched on surface 16 of medium 10 and propagates toward detection transducer 14. This surface acoustic wave has associated with it an electric field which decays exponentially from surface 16. Charge carriers flowing in the inversion layer 22 due to bias 26 have associated with them an electric field. The interaction of the electric field produced by the moving charge carriers and the electric field associated with the surface acoustic wave yields an energy flow to or from the acoustic wave, depending upon the relative velocities of the charge carriers and the acoustic wave. If the charge carrier velocity is greater than the phase velocity of the acoustic wave, the acoustic wave will gain energy from the electric current stream and will be amplified. If the relative velocity is reversed, the acoustic wave will be depleted in energy.

The amplifier of FIG. 1A is easily constructed by a variety of known techniques. For instance, the wave propagating medium 10 has its top surface 16 polished, after which a semiconductor 20, having diffused regions 24 therein, is brought into contact with the top surface 16. Of course, the overlying semiconductor 20 can be grown on the top surface 16 of piezoelectric medium 10 and N-type regions 24 produced therein by ion implantation. Contact to these N-regions is made in a conventional way. Also, contact to the substrate is made via deposited metal electrode 30. If desired, the overlying medium 20 can be bonded to wave propagating medium 10 by a suitable electrically non-conductive bonding layer. The bonding layer can also exhibit a high dielectric permeativity, such as silicon grease. Of course, other methods for making the amplifier structure of FIG. 1A will be apparent to those skilled in the art of semiconductor fabrication.

FIGS. 1B and 1C are energy band diagrams for a silicon overlying medium 20 in the case of zero substrate bias $V_b$ and a non-zero substrate bias. In FIG. 1B, conduction band $E_C$ and valence band $E_V$ are separated by the band gap of the structure, illustrated by $E_G$. The Fermi level is $E_F$. The acceptor impurities represented by circled electrons 32, are located close to the valence band. A relatively large group of free electrons 34 is located in the inversion layer, represented by $I_L$. A depletion layer adjacent inversion layer $I_1$ is represented by the symbol $D_L$.

In FIG. 1C, a substrate bias $V_b$ is applied. The substrate bias serves to widen depletion layer $D_L$ and a smaller number of electrons 34 are found in the inversion layer 22. Consequently, the conductivity of this layer is reduced and the amplification (or attenuation) of the surface acoustic wave is changed. This is an additional amplification control, in contrast with prior art acoustic amplifiers wherein only the velocity of such charge carriers could be changed to change amplification. As is apparent from this diagram, if an AC bias is applied to the substrate 20, the amplification of the acoustic wave will be modulated, according to the frequency of the applied substrate bias $V_b$.

Figure 2A:
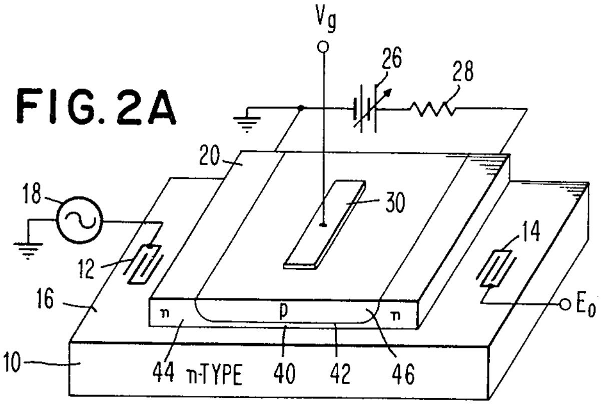
FIG. 2A shows a surface acoustic wave amplifier having a variable width depletion layer in close proximity to the surface on which the surface acoustic wave travels.

FIG. 2A illustrates another embodiment for a surface acoustic wave amplifier having a region of variable conductivity. In this case, the region is a thin layer adjacent a variable width depletion layer. Again, the conductivity of the region is electronically variable. For clarity, the same reference numerals are used here and in FIG. 1A, wherever possible.

In more detail, a wave propagating medium 10 similar to that of FIG. 1A has located thereon input transducer 12 and output transducer 14. A source 18 of electrical excitation is connected to input transducer 12. In operation, electrical oscillation of the input transducer will cause a Rayleigh surface acoustic wave to propagate along surface 16 of wave propagating medium 10 to output transducer 14. At the output transducer, the acoustic wave will be converted to an electrical signal, represented by $E_o$.

Located adjacent surface 16 is a second medium 20 having a region of variable conductivity. In this case, a depletion barrier layer is formed in region 40 by a PN junction 42 in semiconductor material 20. Connected across the N-type region 44 is a variable bias 26 and resistor 28, which are used to accelerate the flow of carriers in the N-type depletion layer 40. The P-type region 46 has an electrical contact 30 thereon which is connected to a source represented by $V_g$. This is the gate voltage which is varied to vary the width of the depletion layer associated with the PN junction 42. Varying the width of the depletion area varies the conductivity of N-type layer 40. That is, the width of the depletion layer controls the conductivity of the bulk layer 40. The width of the depletion layer (with bias) should be sufficient to deplete the portion of N-layer 40 in which the acoustic wave exists. If the N-layer 40 is a few acoustic wavelengths, this will be sufficient. Changing the conductivity of region 40 varies the amplification or attenuation of the Rayleigh wave on surface 16 of medium 10.

It will be evident to one of skill in the art of semiconductor devices that the P-N junction 42 can be replaced by a metal-semiconductor rectifying contact, or by a Schottky barrier. Any of these alternatives will serve to change the conductivity of a region in close proximity to the wave propagating medium 10.

The materials used for both wave propagating medium 10 and overlying medium 20 are the same as those mentioned for the amplifier of FIG. 1A. However, it is preferred that the doping of P-type region 46 be greater than that of the N-type region 44. This will insure that most of the depletion region is on the N-type side of the PN junction 42. Generally, a P-type doping approximately of magnitude one-quarter greater than that of the N-type doping is sufficient. As noted above, the thickness of overlying medium 20 is chosen in regard to the amount of voltage available. Generally, it is desirable to be able to completely eliminate all charge carriers in N-type region 40 by appropriate gate bias $V_g$.

The principle of operation of this device is substantially similar to that of the amplifier of FIG. 1A. That is, source 26 accelerates charge carriers in the N-type region 40 and the accelerating carriers have associated therewith an electric field. This electric field couples to the electric field associated with the surface acoustic wave, the amplify or attenuate the acoustic wave. Application of a gate bias $V_g$ changes the conductivity of thin N-type layer 40 to change the amplification or attenuation of the acoustic wave. As before, the amplification or attenuation can also be varied by changing the bias of source 26.

The device of FIG. 2A is made by conventional semi-conductor techniques, as was the amplifier of FIG. 1A. If desired, the overlying medium 20 can be in contact with surface 16 or can be separated slightly from surface 16 by a thin bonding layer. An N-type semiconductor 20 can be deposited on wave propagation medium 10 and later be doped to produce a P-region 46. After this, metal electrodes are attached and are connected to the various sources $V_g$ and 26. Acoustic transducers 12, 14 are applied to surface 16 by conventional techniques and need not be interdigital transducers such as those shown. Any transducer which will launch a surface acoustic wave on medium 10 and detect such a wave is suitable.

For the amplifier of FIG. 2A, the following relation exists.

$$D_L \approx \sqrt{\frac{k(V_{eg}+V_g)}{2\pi q N_d}} \qquad (4)$$

where $D_L$ = depletion layer width into the n-type region 40,
$N_d$ = the doping level of the N-type region 40, and
$k$, $V_{eg}$, $V_g$, $q$ are as defined previously.

If the doping level $n_a$ of P-type region 46 is $\geq 10^{19}/cm^3$, and the doping level of N-type region 40 is $10^{15}/cm^3$, while the thickness of N-type region 40 is 3 microns, then $D_L^\circ = D_L$ at zero bias $V_g = 1$ micron, and
$D_L \rightarrow 3$ microns at $V_g \simeq 10$ volts.

Thus, only small voltages are needed to completely deplete charge carriers in region 40. In this particular case, silicon was chosen as the overlying semiconductor 20, and the doping levels, thickness, etc. are easily obtainable by conventional techniques.

Figure 2B:
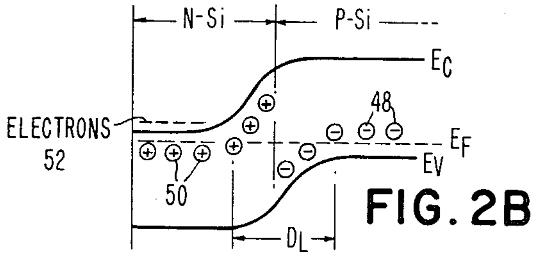
FIG. 2B is an energy band diagram of the amplifier of FIG. 2A, in which the applied bias $V_g$ is zero.
Figure 2C:
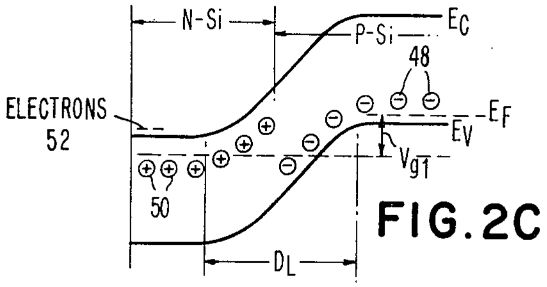
FIGS. 2C and 2D are energy band diagrams for the amplifier for FIG. 2A, having non-zero applied gate potentials $V_{g1}$ and $V_{g2}$, respectively where $V_{g2}$ is greater than $V_{g1}$.
Figure 2D:
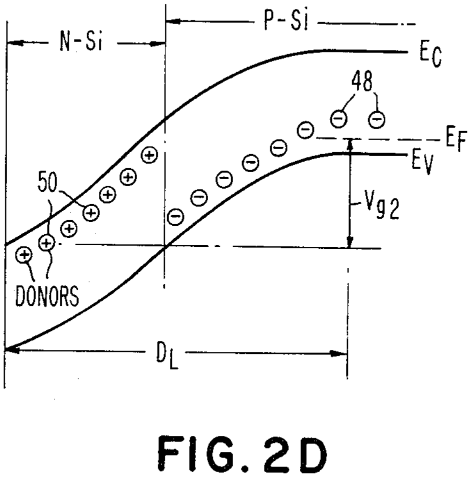

FIGS. 2B, 2C and 2D are energy band diagrams for the amplifier of FIG. 2A. Specifically, these diagrams illustrate the energy levels across the PN junction 42. In the examples chosen, the overlying material 20 is silicon.

In FIG. 2B, a depletion region, represented by $D_L$, extends on both sides of junction 42. The acceptor impurities are indicated by circled electrons 48 while the donor impurities are indicated by circled holes 50. Located in the conduction band of the N-type material are free electrons 52.

In FIG. 2C, a non-zero gate bias $V_{g1}$ is applied which causes the depletion layer $D_L$ to widen. This reduces the number of free electrons in N-region 40.

FIG. 2D, the applied gate voltage is $V_{g2}$($V_{g2} > {}_{Vg1}$), a voltage sufficient to remove all free electrons 52 from N-region 40. In this example, the depletion layer $D_L$ extends across the entire width region 40. This will completely cut off the amplification of the Rayleigh acoustic wave, since there are no charge carriers in the N-region 40 to which the electric field associated with the acoustic wave can couple.

What has been shown is an amplifier for surface acoustic waves in which an additional control of amplification is provided. Whereas previous amplifiers varied amplification only by changing the velocity of the charge carriers therein, this amplifier provides a region whose conductivity is variable, usually by electrical means, but not necessarily so. Whereas amplifiers using an inversion layer and a depletion layer have been shown, other ways of providing a region of variable conductivity for coupling to the traveling acoustic wave can be envisioned. In addition to the extra amplification control, these amplifiers are more efficient and have less heat build-up, and enable one to shift the frequency of maximum gain during operation of the amplifier.

What is claimed is:

1. A device for surface acoustic waves comprising:
- a piezoelectric medium capable of supporting a surface acoustic wave;
- means for generating said acoustic wave in said piezoelectric medium;
- a region in which charge carriers exist, said region being sufficiently close to said piezoelectric medium that the electric field associated with said charge carriers interacts with the electric field associated with said acoustic wave, said interaction causing amplification of said acoustic wave depending on the relative velocity of said charge carriers and said acoustic wave;
- means for accelerating said charge carriers in said region for adjustment of said relative velocity to produce amplification of said acoustic wave;
- means for varying the number of charge carriers in said region to vary said amplification; and
- means for detecting said acoustic wave after said interaction with said charge carriers.

2. The device of claim 1, where said region comprises a Schottky barrier diode.

3. The device of claim 1, where said region comprises a semiconductor having a layer close to said piezoelectric medium in which the number of charge carriers is variable.

4. The device of claim 3, where said layer includes an inversion layer whose conductivity is variable.

5. The device of claim 3, where said layer includes a p-n junction having a depletion layer associated therewith, the width of said depletion layer being dependent on said means for varying the number of charge carriers.

6. The device of claim 1, where said means for varying the number of charge carriers is an electrical means.

7. The device of claim 6, where said electrical means is a variable AC source.

8. The device of claim 1, where said region comprises a metal-semiconductor rectifying contact.

9. The device of claim 1, where said piezoelectric medium is a semiconductor.

10. A device for surface acoustic waves, comprising:
- a piezoelectric medium capable of supporting a surface acoustic wave on one surface thereof;
- means for generating said surface acoustic wave on said piezoelectric medium and for detecting said surface acoustic waves;
- a second medium adjacent said surface, said second medium having a region therein which is in close proximity to said surface;
- means for accelerating charge carriers in said region, said accelerating carriers interacting with said surface acoustic wave to provide amplification of said acoustic wave when the velocity of said carriers is greater than the velocity of said acoustic wave;
- means for changing the number of charge carriers in said region to vary said amplification of acoustic waves in said device; and
- means for detecting said surface acoustic waves after interaction with said charge carriers.

11. The device of claim 10, wherein said piezoelectric medium and said second medium are comprised of semiconductors, said piezoelectric medium and said second medium being in physical contact at the surface on which said acoustic wave travels.

12. The device of claim 10, where said region is an inversion layer.

13. The device of claim 10, where said region includes a semiconductor layer having a P-N junction therein, the depletion layer associated with said junction being variable in width.

14. The device of claim 10, where said second medium comprises a metal-semiconductor rectifying contact, said semiconductor being in contact with the surface of said piezoelectric medium on which said acoustic wave travels.

15. The device of claim 19 where said region comprises a Schottky barrier diode.

* * * * *